United States Patent
Yeh et al.

(10) Patent No.: US 10,242,940 B2
(45) Date of Patent: Mar. 26, 2019

(54) FAN-OUT BALL GRID ARRAY PACKAGE STRUCTURE AND PROCESS FOR MANUFACTURING THE SAME

(71) Applicant: Advanced Semiconductor Engineering, Inc., Kaohsiung (TW)

(72) Inventors: Jung-Liang Yeh, Kaohsiung (TW); Meng-Jen Wang, Kaohsiung (TW); Tsung-Yueh Tsai, Kaohsiung (TW); Chih-Ming Hung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/655,724

(22) Filed: Jul. 20, 2017

(65) Prior Publication Data

US 2018/0108602 A1 Apr. 19, 2018

Related U.S. Application Data

(60) Provisional application No. 62/409,252, filed on Oct. 17, 2016.

(51) Int. Cl.
| | |
|---|---|
| *H01L 23/498* | (2006.01) |
| *H01L 23/31* | (2006.01) |
| *H01L 23/00* | (2006.01) |
| *H01L 25/18* | (2006.01) |

(Continued)

(52) U.S. Cl.
CPC .... *H01L 23/49816* (2013.01); *H01L 23/3128* (2013.01); *H01L 23/49838* (2013.01); *H01L 24/13* (2013.01); *H01L 24/97* (2013.01); *H01L 25/18* (2013.01); *G06K 9/00013* (2013.01); *H01L 21/561* (2013.01); *H01L 21/568* (2013.01); *H01L 24/16* (2013.01); *H01L 24/48* (2013.01); *H01L 24/81* (2013.01); *H01L 24/85* (2013.01); *H01L 2224/13083* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/16225* (2013.01); *H01L 2224/32225* (2013.01); *H01L 2224/48091* (2013.01); *H01L 2224/73204* (2013.01); *H01L 2224/81815* (2013.01); *H01L 2224/83855* (2013.01); *H01L 2924/00014* (2013.01); *H01L 2924/014* (2013.01); *H01L 2924/15321* (2013.01); *H01L 2924/15322* (2013.01);

(Continued)

(58) Field of Classification Search
CPC ......... H01L 23/49816; H01L 23/49838; H01L 23/3128; H01L 23/3157
See application file for complete search history.

(56) References Cited

U.S. PATENT DOCUMENTS

| | | |
|---|---|---|
| 2015/0004756 A1 | 1/2015 | Chi et al. |
| 2018/0108602 A1* | 4/2018 | Yeh .......................... H01L 24/13 |

* cited by examiner

*Primary Examiner* — Mark Prenty
(74) *Attorney, Agent, or Firm* — Foley & Lardner LLP; Cliff Z. Liu

(57) ABSTRACT

A surface mount structure comprises a redistribution structure, an electrical connection and an encapsulant. The redistribution structure has a first surface and a second surface opposite the first surface. The electrical connection is on the first surface of the redistribution structure. The encapsulant encapsulates the first surface of the redistribution structure and the electrical connection. A portion of the electrical connection is exposed by the encapsulant.

21 Claims, 14 Drawing Sheets

(51) Int. Cl.
*G06K 9/00* (2006.01)
*H01L 21/56* (2006.01)
(52) U.S. Cl.
CPC .................. *H01L 2924/181* (2013.01); *H01L 2924/19105* (2013.01)

ately, to a package structure with a low thickness, having a strip-type fan-out BGA structure, and with a low manufacturing cost. -->

FAN-OUT BALL GRID ARRAY PACKAGE STRUCTURE AND PROCESS FOR MANUFACTURING THE SAME

CROSS-REFERENCE TO RELATED APPLICATIONS

This application claims the benefit of and priority to U.S. Provisional Patent Application 62/409,252, filed Oct. 17, 2016, which is incorporated herein by reference in its entirety.

BACKGROUND

1. Technical Field

The present disclosure relates generally to a fan-out ball grid array (BGA) package structure, and more particularly, to a package structure with a low thickness, having a strip-type fan-out BGA structure, and with a low manufacturing cost.

2. Description of the Related Art

Semiconductor device packaging has continued to receive a significant amount of attention from designers and manufacturers of electronic products. The attention is based upon the market demand for electronic products with greater efficiency, higher performance, and smaller dimensions.

BGA packages were developed attempting to meet the demand for packages having higher lead counts and smaller footprints. A BGA package is typically a square package with terminals, in the form of an array of solder balls, protruding from the bottom of the package. These terminals are designed to be mounted on a plurality of pads located on the surface of a print circuit board, or other interconnection. The traces of the BGA are generally fabricated on laminated substrates (e.g., substrates based on bismaleimide triazine (BT)) or polyimide-based films. Therefore, the entire area of such a substrate or a film can be used to route the interconnection. BGA has the advantage of lower ground or power inductance thereby assigning ground or power nets via a shorter current path to the printed circuit board (PCB). Thermally enhanced mechanisms (heat sink, thermal balls, etc.) can be applied to BGA to reduce thermal resistance. The functional capabilities of the BGA package technology benefit high-power and high-speed integrated chips (ICs) that specify enhanced electrical and thermal performance.

SUMMARY

In some embodiments, a surface mount structure comprises a redistribution structure, an electrical connection and an encapsulant. The redistribution structure has a first surface and a second surface opposite the first surface. The electrical connection is on the first surface of the redistribution structure. The encapsulant encapsulates the first surface of the redistribution structure and the electrical connection. A portion of the electrical connection is exposed by the encapsulant.

In some embodiments, a semiconductor device package is to be mounted on an external circuit board by a surface mount technique. The semiconductor device package comprises a redistribution structure, a semiconductor device, an electrical connection and an encapsulant. The redistribution structure has a first surface and a second surface opposite the first surface. The semiconductor device is on the first surface of the redistribution structure. The electrical connection is on the first surface of the redistribution structure. The encapsulant encapsulates the first surface of the redistribution structure, the semiconductor device and the electrical connection. A portion of the electrical connection is exposed by the encapsulant.

In some embodiments, an electronic device comprises a circuit board and a semiconductor device package. The circuit board has a first surface. The semiconductor device package is mounted on the first surface of the circuit board. The semiconductor device package comprises a redistribution structure, a semiconductor device, an electrical connection and an encapsulant. The redistribution structure has a first surface and a second surface opposite the first surface. The semiconductor device is on the first surface of the redistribution structure. The electrical connection is on the first surface of the redistribution structure. The encapsulant encapsulates the first surface of the redistribution structure, the semiconductor device and the electrical connection.

Figure 1A:
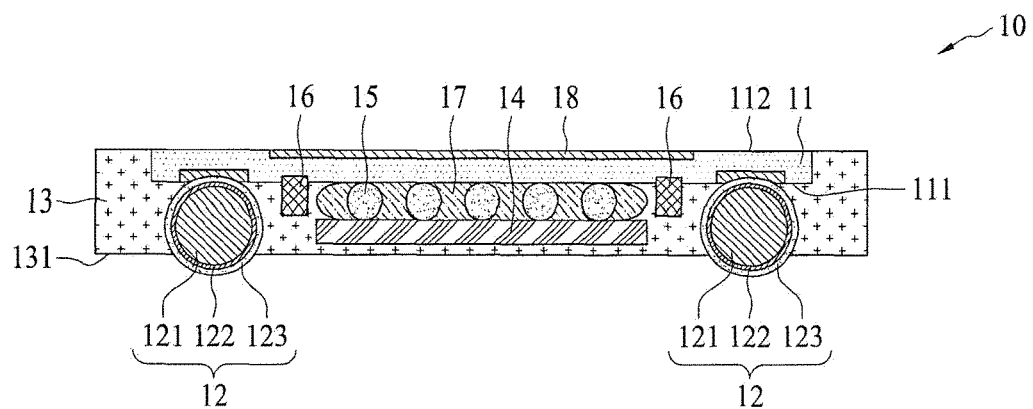
FIG. 1A illustrates a cross-sectional view of a surface mount structure in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

In packaging technologies such as BGA packaging technologies, a molding compound may be formed around a die of a package to provide extra surface area for supporting the fan-out interconnect structure. A redistribution layer (RDL) of the interconnect structure electrically connects input/output (I/O) pads on the die to external I/O pads on the fan-out interconnect structure. In particular, a BGA package structure may include a semiconductor device (e.g. a flip-chip die or a wire-bond die) that is generally attached to a carrier (e.g. substrate, lead frame, etc.) and molded by an encapsulation layer to form a semiconductor device package.

However, some semiconductor devices (e.g. finger print sensor die) which serve certain specific functions may be mounted to a top carrier (e.g., a carrier that has a sensing area) and the top carrier is assembled to a bottom carrier (e.g., a carrier for circuit fan-out) to be mounted to a system board (e.g. a PCB). Such multi-carrier structure may have disadvantages in terms of size (both in X-Y plane and Z height) and manufacturing cost.

FIG. 1A illustrate a cross-sectional view of a surface mount structure 10 in accordance with some embodiments of the present disclosure. The surface mount structure 10 comprises a redistribution structure 11, electrical connections 12, an encapsulant 13, a semiconductor device 14, bumps 15, electronic components 16 and an under-fill layer 17. The redistribution structure 11 has a surface 111 and a surface 112 opposite the surface 111. At least one of the electrical connections 12 is on the surface 111 of the redistribution structure 11. The encapsulant 13 encapsulates the surface 111 of the redistribution structure 11 and the electrical connections 12. A portion of each electrical connection 12 is exposed by the encapsulant 13.

The semiconductor device 14 is mounted on the surface 111 of the redistribution structure 11. The semiconductor device 14 and the redistribution structure 11 are electrically connected by the bumps 15. In some embodiments, the space between the bumps is filled with an under-fill layer 17. The electrical connections 12 surround a periphery of the semiconductor device 14 and are used to fan-out the inputs and outputs of the semiconductor device 14. The electronic components 16 (e.g., resistors or capacitors) are also mounted on the surface 111 of the redistribution structure 11. Both the semiconductor device 14 and the electronic components 16 are encapsulated by the encapsulant 13. In some embodiments, the surface mount structure 10 further comprises a sensing area 18 adjacent to the second surface 112 of the redistribution structure 11. The sensing area 18 can be used for, e.g., finger print sensing or any other light-sensing purposes.

As shown in FIG. 1A, the redistribution structure 11 does not extend to the sidewall of the encapsulant 13. Therefore, the width of the surface mount structure 10 (which is defined by the distance between the two sidewalls of the encapsulant 13) can be adjusted by cutting the encapsulant 13 to meet a desired width of the surface mount structure 10.

In some embodiments, the electrical connection 12 comprises a core, which comprises a metal core or sphere 121 and a barrier layer 122 surrounding the metal core or sphere 121. The electrical connection 12 further comprises a solder layer 123 surrounding the metal sphere 121 and the barrier layer 122 of the core.

In some embodiments, the electrical connections 12 can be, e.g., solder balls, metal pillars (e.g., copper pillars), conductive balls including a copper core surrounded by a solder shell (e.g., Sn), conductive balls including high melting temperature solder cores (e.g., high melting temperature Sn) surrounded by low melting temperature solder shells (e.g., high melting temperature Sn), or a combination of two or more thereof.

In some embodiments, the under-fill layer 17 can be, e.g., a capillary under-fill. In some embodiments, a portion of the encapsulant 13 extending below the die also may serve as an under-fill.

Figure 1B:
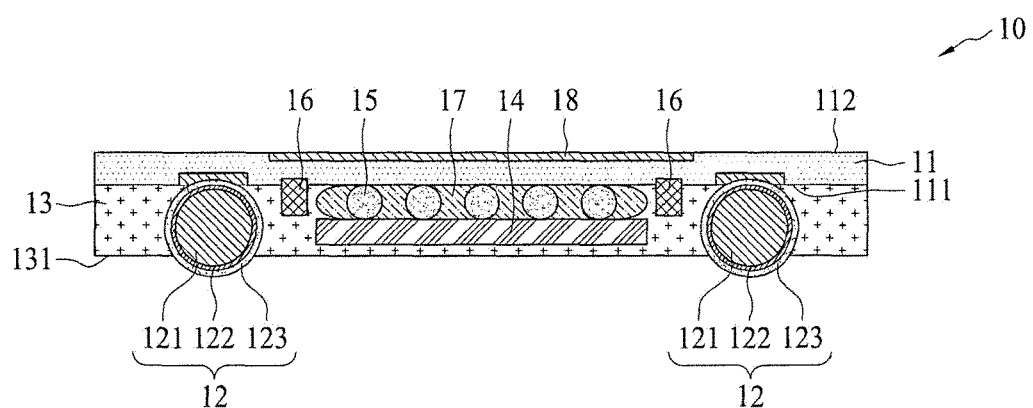
FIG. 1B illustrates a cross-sectional view of a surface mount structure in accordance with some embodiments of the present disclosure.

FIG. 1B illustrate a cross-sectional view of a surface mount structure 10 in accordance with some embodiments of the present disclosure. The surface mount structure 10 shown in FIG. 1B is similar in certain respects to the surface mount structure 10 shown in FIG. 1A, except that in FIG. 1B, the redistribution structure 11 extends to the sidewalls of the encapsulant 13. Therefore, in at least some embodiments, the width of the surface mount structure 10 (which is defined by the distance between the two sidewalls of the encapsulant 13) may not be adjusted by cutting the encapsulant 13. Compared with the surface mount structure 10 shown in FIG. 1B, the package size of the surface mount structure 10 shown in FIG. 1A may be determined by the size of the encapsulant 13 after singulation, instead of being specified by the size of the redistribution structure 11, thereby providing greater package size design flexibility.

Figure 2A:
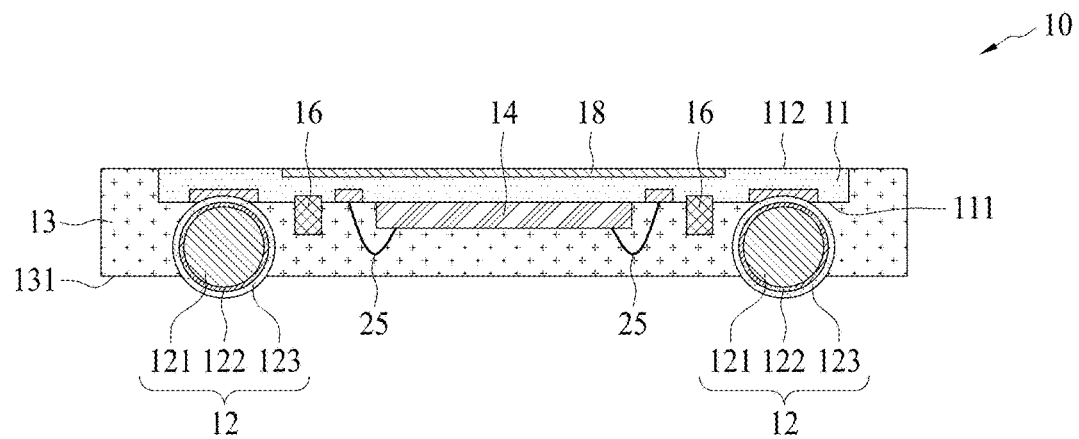
FIG. 2A illustrates a cross-sectional view of a surface mount structure in accordance with some embodiments of the present disclosure.

FIG. 2A illustrate a cross-sectional view of a surface mount structure 10 in accordance with some embodiments of the present disclosure. The surface mount structure 10 shown in FIG. 2A is similar in certain respects to the surface mount structure 10 shown in FIG. 1A, except that in FIG. 2A, the semiconductor device 14 is electrically connected to the redistribution structure 11 through bonding wires 25. In some embodiments, the bonding wires 25 can be, e.g., gold (Au) wires, copper (Cu) wires, metal alloy wires, silver (Ag) wires, aluminum (Al) wires, or a combination of two or more thereof.

Figure 2B:
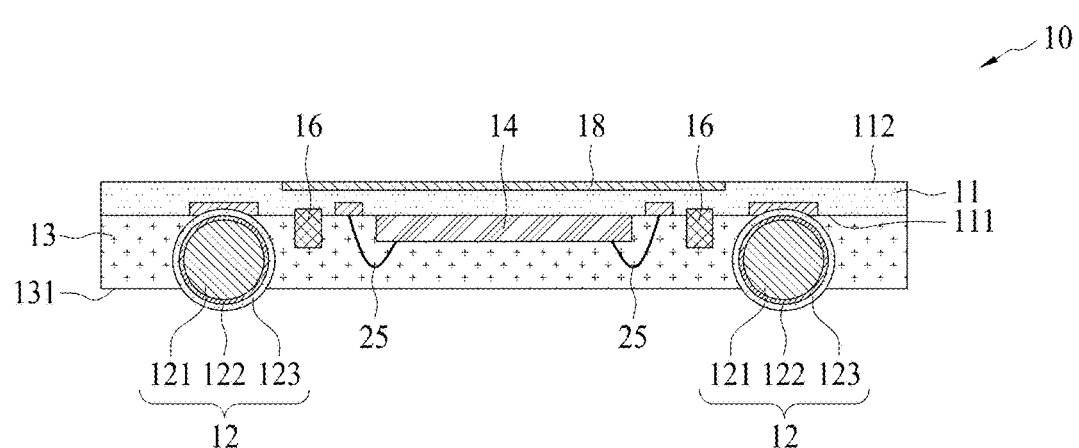
FIG. 2B illustrates a cross-sectional view of a surface mount structure in accordance with some embodiments of the present disclosure.

FIG. 2B illustrate a cross-sectional view of a surface mount structure 10 in accordance with some embodiments of the present disclosure. The surface mount structure 10 shown in FIG. 2B is similar in certain respects to the surface mount structure 10 shown in FIG. 2A, except that in FIG. 2B, the redistribution structure 11 extends to the sidewalls of the encapsulant 13. Therefore, in at least some embodiments, the width of the surface mount structure 10 (which is defined by the distance between the two sidewalls of the encapsulant 13) may not be adjusted by cutting the encapsulant 13. Compared with the surface mount structure 10 shown in FIG. 2B, the package size of the surface mount structure 10 shown in FIG. 2A may be determined by the size of the encapsulant 13 after singulation, instead of being specified by the size of the redistribution structure 11, thereby providing greater package size design flexibility.

Figure 3:
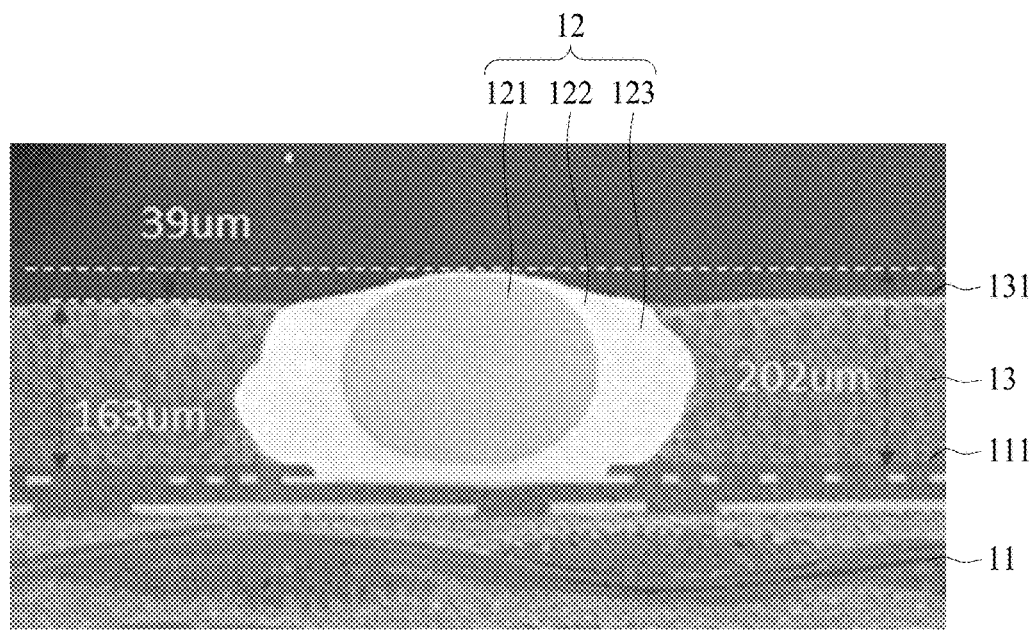
FIG. 3 illustrates a cross-sectional view of an electrical connection of a surface mount structure in accordance with some embodiments of the present disclosure.

FIG. 3 illustrates a cross-sectional view of an electrical connection of a surface mount structure in accordance with some embodiments of the present disclosure. The electrical connection 12 comprises a core, which comprises a metal sphere 121 and a barrier layer 122 surrounding the metal sphere 121. The electrical connection 12 further comprises a solder layer 123 surrounding the metal sphere 121 and the barrier layer 122 of the core. The barrier layer 122 is on the interface between the metal sphere 121 and the solder layer 123. The thickness of the barrier layer 122 is relatively thin (e.g., about 1 micrometer (μm), about 2 μm, about 3 μm, about 5 μm, about 10 μm, or about 1 μm to about 10 μm).

In some embodiments, the metal sphere 121 can be formed with, e.g., copper (Cu), gold (Au) or a combination thereof. The barrier layer 122 can be formed with, e.g., nickel (Ni). The solder layer can be formed with, e.g., tin (Sn)-based solders (e.g., tin-silver-copper (SAC) solder, tin-silver (SnAg) solder, etc.). In some embodiments, the core including the metal sphere 121 and the barrier layer 122 is pressed into an elliptical-like or oval-like shape (e.g., having an aspect ratio greater than 1) during a molding process where a film layer is used to suppress and shape the encapsulant 13. However, at least in some embodiments, even after the film layer is removed, the core including the metal sphere 121 and the barrier layer 122 may not recover from the elliptical-like or oval-like shape to the sphere-like shape since the modulus of elasticity (e.g., elastic modulus, tensile modulus, or Young's modulus) of the core including the metal sphere 121 and the barrier layer 122 may be relatively high.

Figure 4:
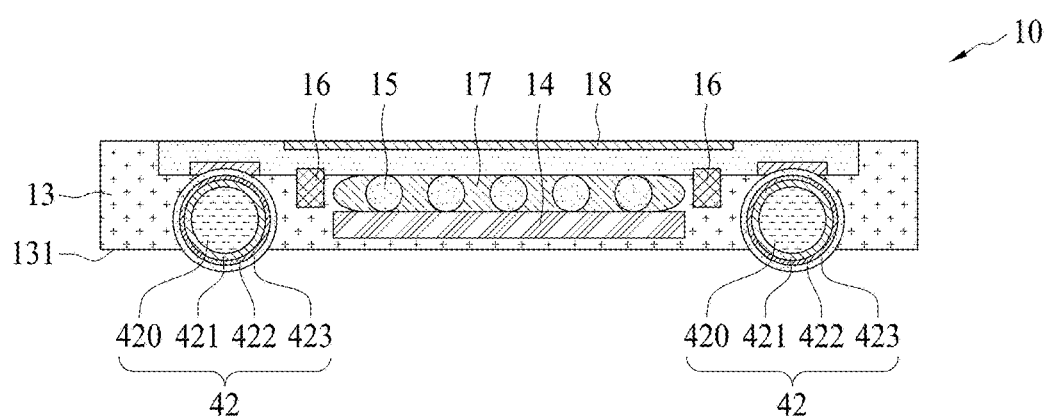
FIG. 4 illustrates a cross-sectional view of a surface mount structure in accordance with some embodiments of the present disclosure.

FIG. 4 illustrates a cross-sectional view of a surface mount structure 10 in accordance with some embodiments of the present disclosure. The surface mount structure 10 shown in FIG. 4 is similar in certain respects to the surface mount structure 10 shown in FIG. 1A, except that in FIG. 4, the electrical connection 42 comprises a core, which comprises an elastic sphere or core 420, a metal layer 421 surrounding the elastic sphere or core 420, and a barrier layer 422 surrounding the metal layer 421. The electrical connection 42 comprises a solder layer 423 surrounding the core. In some embodiments, the elastic sphere 420 comprises, e.g., a polymer. In some embodiments, the elastic sphere 420 has a modulus of elasticity (e.g., elastic modulus, tensile modulus, or Young's modulus) ranged from approximately 1 gigapascal (GPa) to approximately 50 GPa, from approximately 0.5 GPa to approximately 100 GPa, or from approximately 0.1 GPa to approximately 500 GPa. In some embodiments, the elastic sphere 420 has a modulus of elasticity (e.g., elastic modulus, tensile modulus, or Young's modulus) ranged from approximately 3 GPa to approximately 6 GPa, from approximately 1 GPa to approximately 10 GPa, from approximately 0.5 GPa to approximately 50 GPa. The modulus of elasticity (e.g., elastic modulus, tensile modulus, or Young's modulus) of copper is about 117 GPa.

Figure 5:
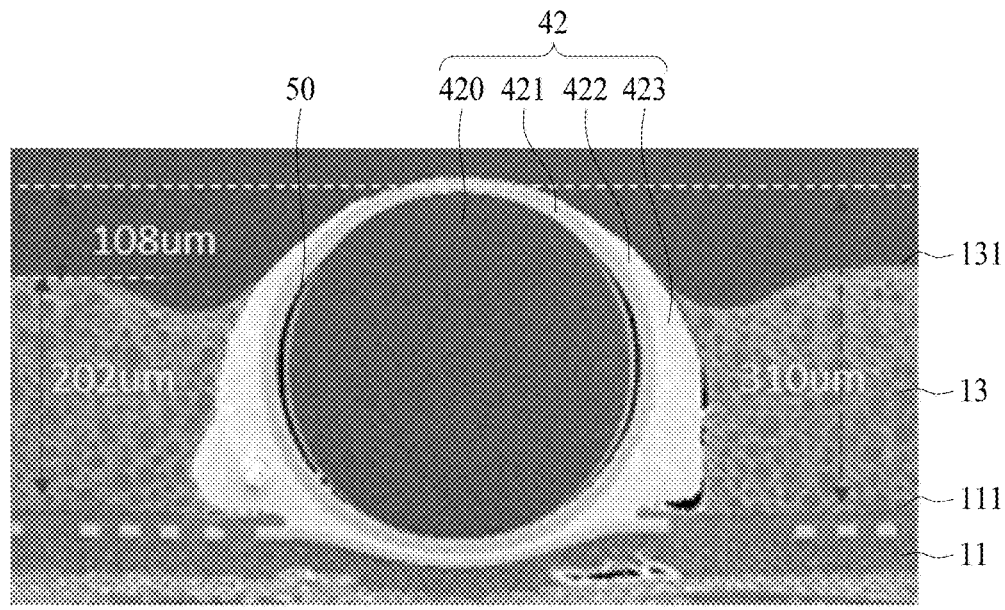
FIG. 5 illustrates a cross-sectional view of an electrical connection of a surface mount structure in accordance with some embodiments of the present disclosure.

FIG. 5 illustrates a cross-sectional view of an electrical connection of a surface mount structure in accordance with some embodiments of the present disclosure. The electrical connection 42 comprises a core, which comprises an elastic sphere 420, a metal layer 421 and a barrier layer 422. The metal layer 421 surrounds the elastic sphere 420. The barrier layer 422 surrounds the metal layer 421. The electrical connection 42 further comprises a solder layer 423 surrounding the core. The barrier layer 422 is on the interface between the metal layer 421 and the solder layer 423. The thickness of the barrier layer 422 is relatively thin.

In some embodiments, the elastic sphere 420 can be formed with a polymer. The metal layer 421 can be formed with, e.g., copper (Cu), gold (Au) or a combination thereof. The barrier layer 422 can be formed with nickel (Ni). The solder layer 423 can be formed with tin (Sn)-based solders (e.g., tin-silver-copper (SAC) solder, tin-silver (SnAg) solder, etc.). In some embodiments, the core including 420, 421 and 422 is pressed into an elliptical-like or oval-like shape during a molding process wherein a film layer is used to suppress and shape the encapsulant 13.

In at least some embodiments, since the modulus of elasticity (e.g., elastic modulus, tensile modulus, or Young's modulus) of the elastic sphere 420 can be ranged from approximately 1 GPa to approximately 50 GPa, from approximately 0.5 GPa to approximately 100 GPa, or from approximately 0.1 GPa to approximately 500 GPa, the elastic sphere 420 can recover from the elliptical-like or oval-like shape to the sphere-like shape after the film layer is removed (e.g., having an aspect ratio of about 1). However, the metal layer 421 and the barrier layer 422 may not recover from the elliptical-like or oval-like shape to the sphere-like shape because the modulus of elasticity (e.g., elastic modulus, tensile modulus, or Young's modulus) of the metal layer 421 and the barrier layer 422 is relatively high, compared to the modulus of elasticity of the elastic sphere 420. Therefore, the elastic sphere 420 may be separated from the metal layer 421 by a space 50. The metal layer 421 then defines an elliptical-like or oval-like spherical space 50. The space 50 may have no matter in it and may be a vacuum. There may be no air or other gas in the space 50 which may oxidize the metal layer 421.

Moreover, due to the relatively lower modulus of elasticity of the elastic sphere 420, the height of the portion of the electrical connection 42 exposed by the encapsulant 13 in FIG. 5 can be easier to control, in comparison to the height of the portion of the electrical connection 12 exposed by the encapsulant 13 in FIG. 3. As shown in the embodiment of FIG. 5, the height of the portion of the electrical connection 42 exposed by the encapsulant 13 can be at least or larger than, e.g., about 100 μm, about 200 μm, or about 400 μm. For comparison, as shown in the embodiment of FIG. 3, the height of the portion of the electrical connection 12 exposed by the encapsulant 13 is relatively smaller. For surface mounting onto a print circuit board, the height of the portion of the electrical connection 12 exposed by the encapsulant 13 may be specified to be at least or larger than about 50 μm.

Figure 6A:
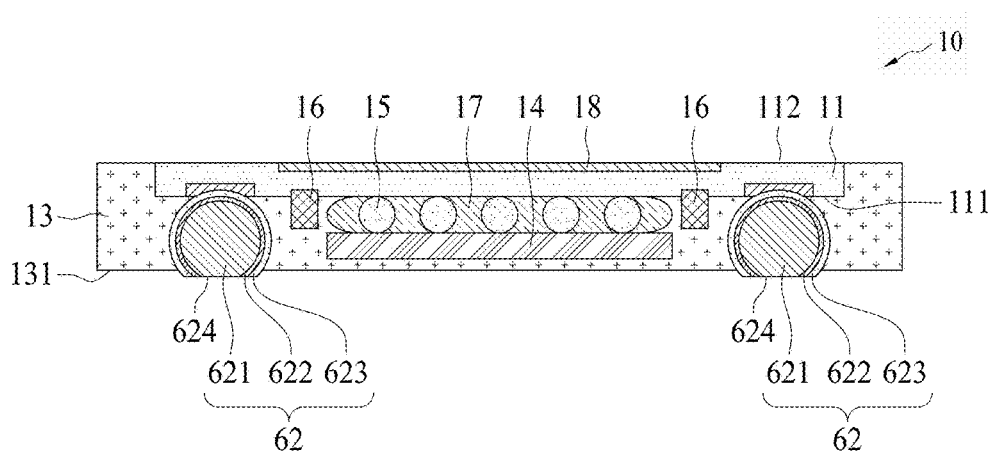
FIG. 6A illustrates a cross-sectional view of a surface mount structure in accordance with some embodiments of the present disclosure.

FIG. 6A illustrates a cross-sectional view of a surface mount structure 10 in accordance with some embodiments of the present disclosure. The surface mount structure 10 shown in FIG. 6A is similar in certain respects to the surface mount structure 10 shown in FIG. 1A, except that in FIG. 6A, the electrical connection 62 is ground to form a substantially planar surface 624 at the bottom of the surface mount structure 10 of FIG. 6A. The encapsulant 13 has a surface 131 and the electrical connection 62 has the substantially planar surface 624. The substantially planar surface 624 of the electrical connection 62 protrudes relative to the surface 131 of the encapsulant 13.

Figure 6B:
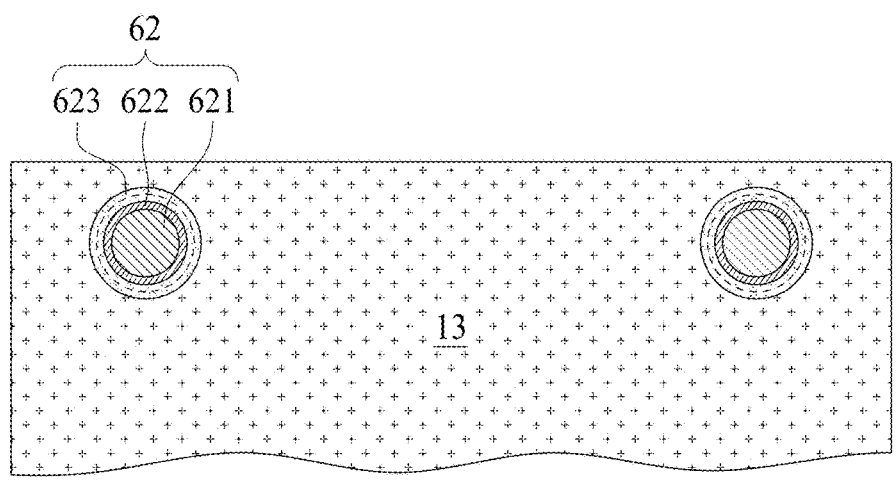
FIG. 6B illustrates a bottom view of a surface mount structure of FIG. 6A in accordance with some embodiments of the present disclosure.

FIG. 6B illustrates a bottom view of the surface mount structure 10 of FIG. 6A. In some embodiments, the electrical connection 62 comprises a metal spherical-like core 621 and a barrier layer 622 surrounding the metal spherical-like core 621. The metal spherical-like core 621 has a substantially planar surface and the barrier layer 622 has a substantially planar surface. The substantially planar surface of the metal spherical-like core 621 and the substantially planar surface of the barrier layer 622 are exposed by the encapsulant 13. The electrical connection 62 further comprises a solder layer 623 surrounding the barrier layer 622. The solder layer 623 has a substantially planar surface. The substantially planar surface of the solder layer 623 is also exposed by the encapsulant 13.

Figure 7A:
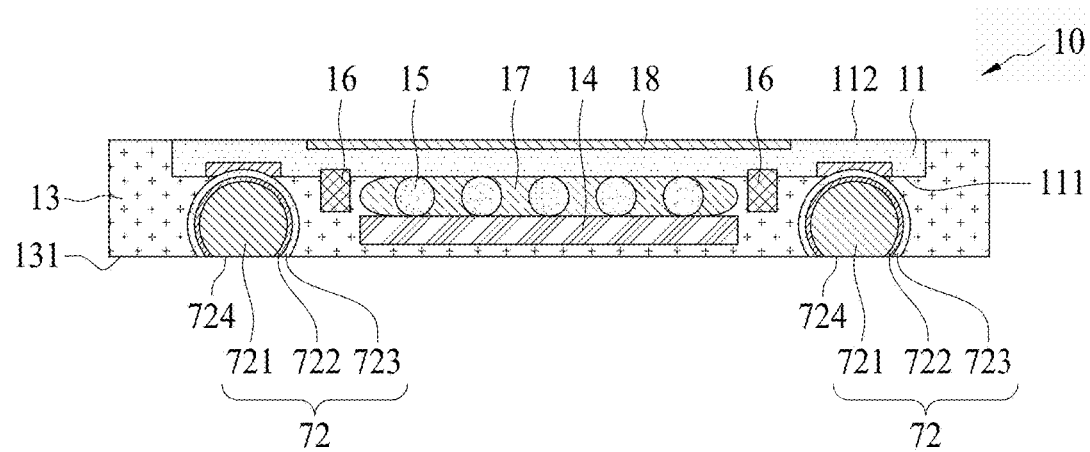
FIG. 7A illustrates a cross-sectional view of a surface mount structure in accordance with some embodiments of the present disclosure.

FIG. 7A illustrates a cross-sectional view of a surface mount structure 10 in accordance with some embodiments of the present disclosure. The surface mount structure 10 shown in FIG. 7A is similar in certain respects to the surface mount structure 10 shown in FIG. 1A, except that in FIG. 7A, the electrical connection 72 is ground to form a substantially planar surface 724 at the bottom of the surface mount structure 10 of FIG. 7A. The encapsulant 13 has a first surface 131 and the electrical connection 72 has the substantially planar surface 724. The substantially planar surface 724 of the electrical connection 72 and the surface 131 of the encapsulant 131 are substantially coplanar.

Figure 7B:
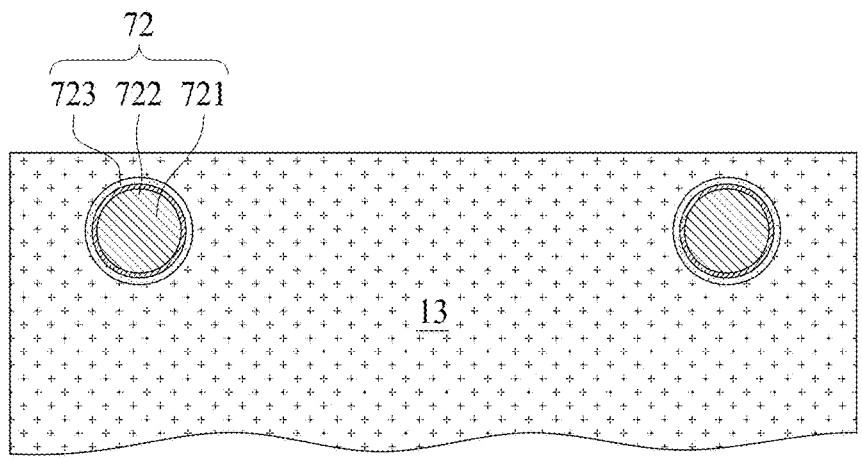
FIG. 7B illustrates a bottom view of the surface mount structure of FIG. 7A in accordance with some embodiments of the present disclosure.

FIG. 7B illustrates a bottom view of the surface mount structure 10 of FIG. 7A. In some embodiments, the electrical connection 72 comprises a metal spherical-like core 721 and a barrier layer 722 surrounding the metal spherical-like core 721. The metal spherical-like core 721 has a substantially planar surface and the barrier layer 722 has a substantially planar surface. The substantially planar surface of the metal spherical-like core 721 and the substantially planar surface of the barrier layer 722 are exposed by the encapsulant 13. The electrical connection 72 further comprises a solder layer 723 surrounding the barrier layer 722. The solder layer 723 has a substantially planar surface. The substantially planar surface of the solder layer 723 is also exposed by the encapsulant 13.

Figure 8A:
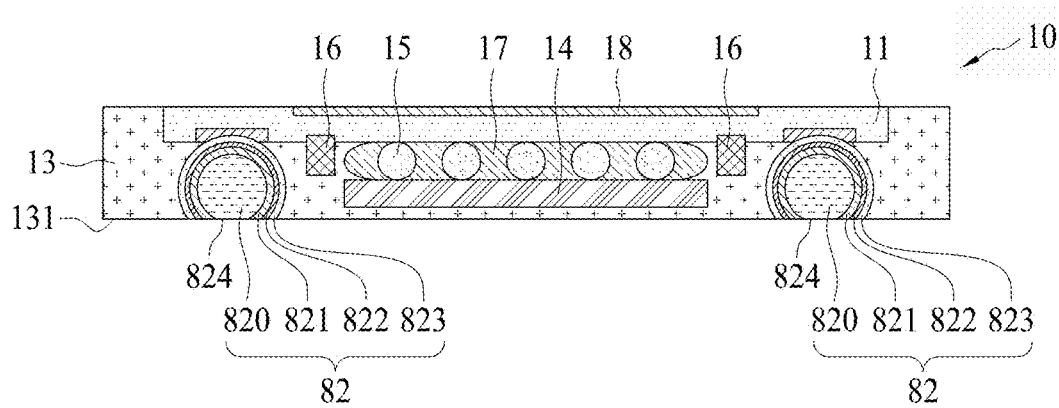
FIG. 8A illustrates a cross-sectional view of a surface mount structure in accordance with some embodiments of the present disclosure.

FIG. 8A illustrates a cross-sectional view of a surface mount structure 10 in accordance with some embodiments of the present disclosure. The surface mount structure 10 shown in FIG. 8A is similar in certain respects to the surface mount structure 10 shown in FIG. 4, except that in FIG. 8A, the electrical connection 82 is ground to form a substantially planar surface 824 at the bottom. The encapsulant 13 has a first surface 131 and the electrical connection 82 has the substantially planar surface 824. The substantially planar surface 824 of the electrical connection 82 and the surface 131 of the encapsulant 131 are substantially coplanar.

Figure 8B:
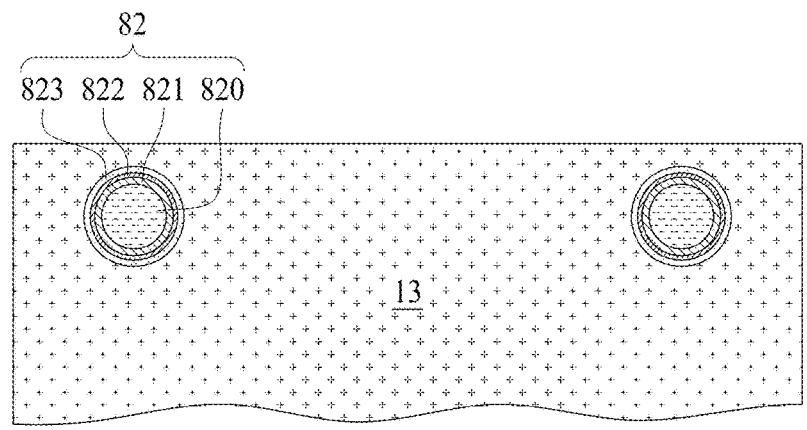
FIG. 8B illustrates a bottom view of a surface mount structure of FIG. 8A in accordance with some embodiments of the present disclosure.

FIG. 8B illustrates a bottom view of the surface mount structure 10 of FIG. 8A. In some embodiments, the electrical connection 82 comprises an elastic spherical-like core 820, a metal layer 821 and a barrier layer 822. The metal layer 821 surrounds the elastic spherical-like core 820. The barrier layer 822 surrounds the metal layer 821. The elastic spherical-like core 820 has a substantially planar surface, the metal layer 821 has a substantially planar surface and the barrier layer 822 has a substantially planar surface. The substantially planar surface of the elastic spherical-like core 820, the substantially planar surface of the metal layer 821 and the substantially planar surface of the barrier layer 822 are exposed by the encapsulant 13. The electrical connection 82 further comprises a solder layer 823 surrounding the barrier layer 822. The solder layer 823 has a substantially planar surface. The substantially planar surface of the solder layer 823 is also exposed by the encapsulant 13.

Figure 9A:
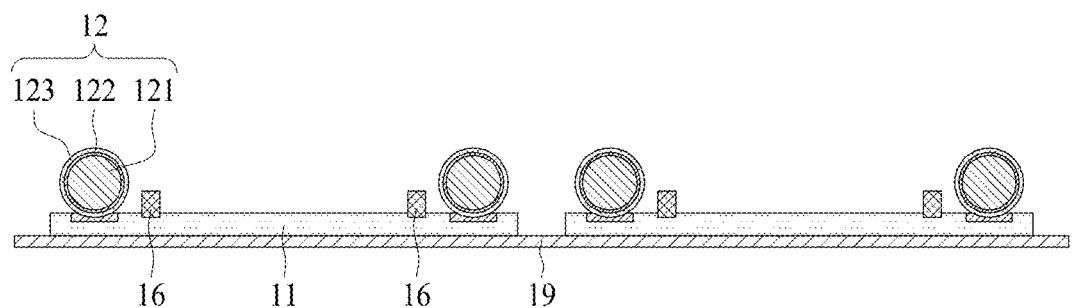
FIG. 9A illustrates one or more stages of a method of manufacturing surface mount structures in accordance with some embodiments of the present disclosure.
Figure 9B:
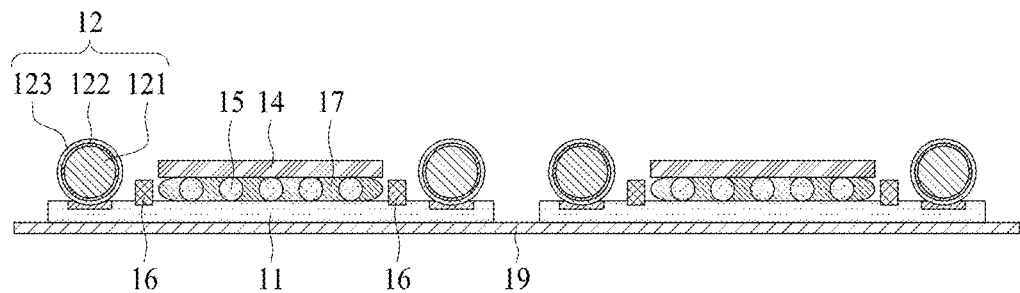
FIG. 9B illustrates one or more stages of a method of manufacturing surface mount structures in accordance with some embodiments of the present disclosure.
Figure 9C:
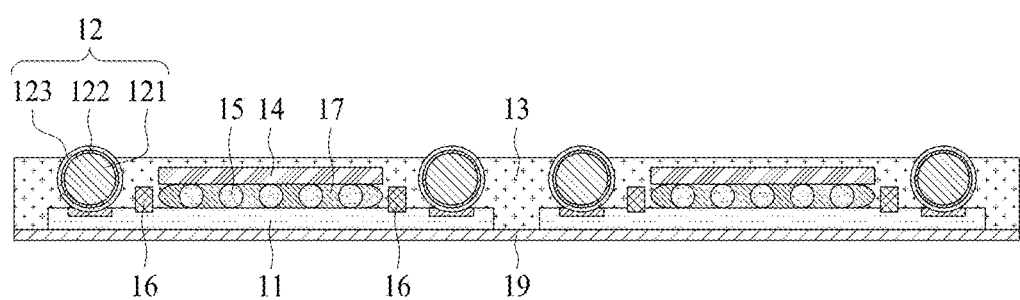
FIG. 9C illustrates one or more stages of a method of manufacturing surface mount structures in accordance with some embodiments of the present disclosure.

FIG. 9A, FIG. 9B and FIG. 9C illustrate various stages of a method of manufacturing surface mount structures in accordance with some embodiments of the present disclosure. FIG. 9A illustrates substrates (e.g., redistribution structures) 11 that have been processed through stages of: baking substrate strip; mounting electronic components 16 on the substrate strip by surface mount technology (SMT); mounting electrical connections 12 on the substrate strip; sawing the substrate strip into individual substrates 11; and disposing substrates 11 on a carrier 19.

As shown in FIG. 9B, the following stages are then performed to the substrates 11: mounting dies 14 onto the substrates 11 by flip-chip (FC) bonding; reflowing solder; flux cleaning; dispersing under-fill (UF) 17; and curing the UF 17.

As shown in FIG. 9C, a film-type molding compound (e.g., encapsulant) 13 is applied on the substrates 11, electrical connections 12 and dies 14. Finally, the following stages are performed to form one or more surface mount structures (e.g., surface mount structure as shown in FIG. 1A): de-taping and singulation by sawing into individual package structures.

Figure 10A:
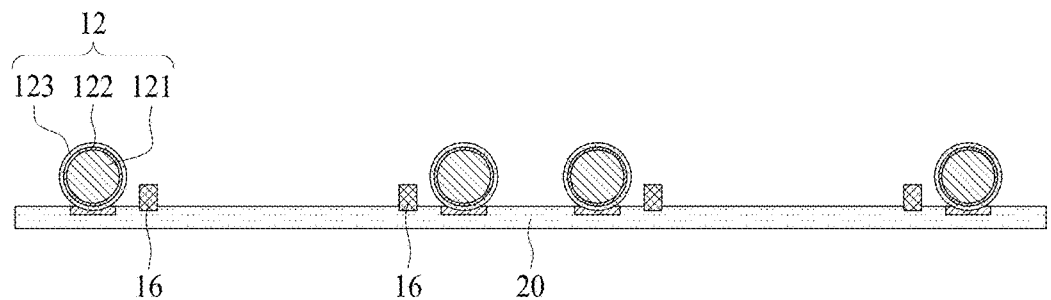
FIG. 10A illustrates one or more stages of a method of manufacturing surface mount structures in accordance with some embodiments of the present disclosure.
Figure 10B:
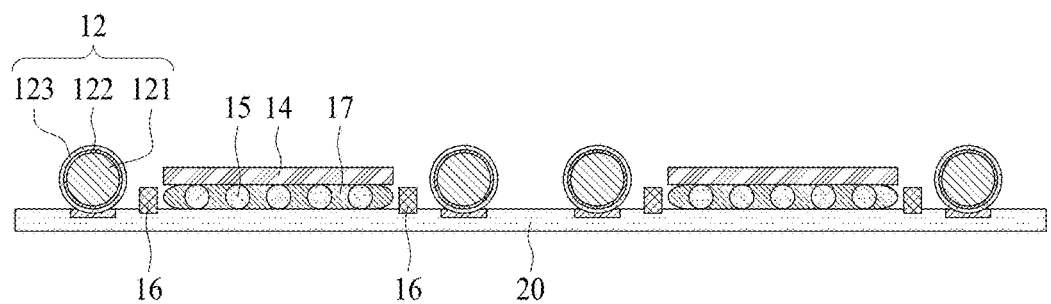
FIG. 10B illustrates one or more stages of a method of manufacturing surface mount structures in accordance with some embodiments of the present disclosure.
Figure 10C:
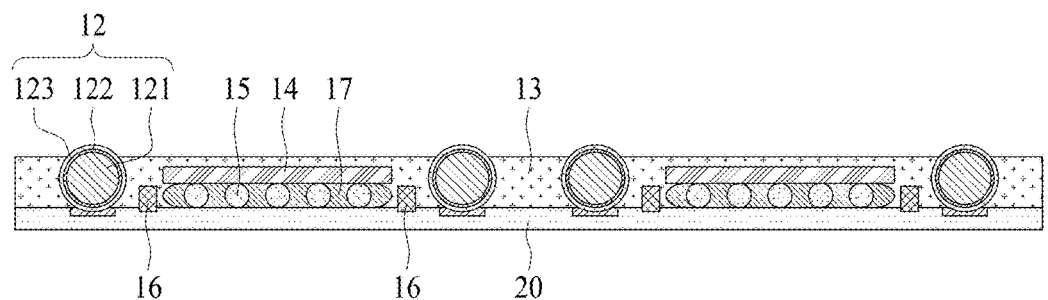
FIG. 10C illustrates one or more stages of a method of manufacturing surface mount structures in accordance with some embodiments of the present disclosure.

FIG. 10A, FIG. 10B and FIG. 10C illustrate various stages of a method of manufacturing surface mount structures in accordance with some embodiments of the present disclosure. The method shown in FIG. 10A, FIG. 10B and FIG. 10C is similar in certain respects to the method shown in FIG. 9A, FIG. 9B and FIG. 9C, except that in FIG. 10A, FIG. 10B and FIG. 10C, the substrate strip 20 is not sawn into individual substrates before molding. Therefore, no carrier is used in the method shown in FIG. 10A, FIG. 10B and FIG. 10C. The substrate strip 20 shown in FIG. 10C is singulated by sawing into individual package structures to form one or more surface mount structures (e.g., surface mount structure 10 as shown in FIG. 1B).

Figure 11A:
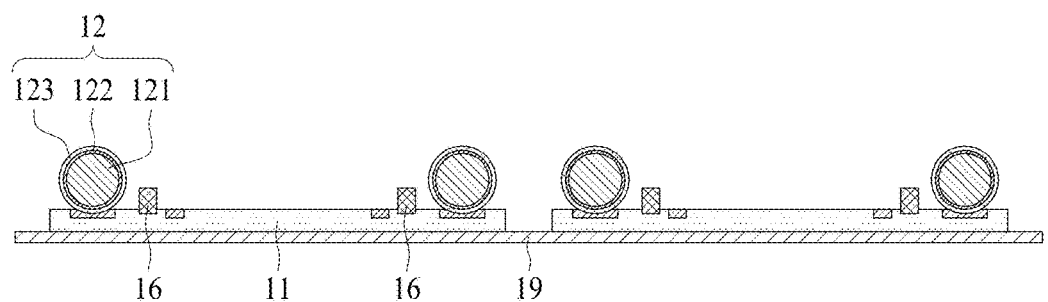
FIG. 11A illustrates one or more stages of a method of manufacturing surface mount structures in accordance with some embodiments of the present disclosure.
Figure 11B:
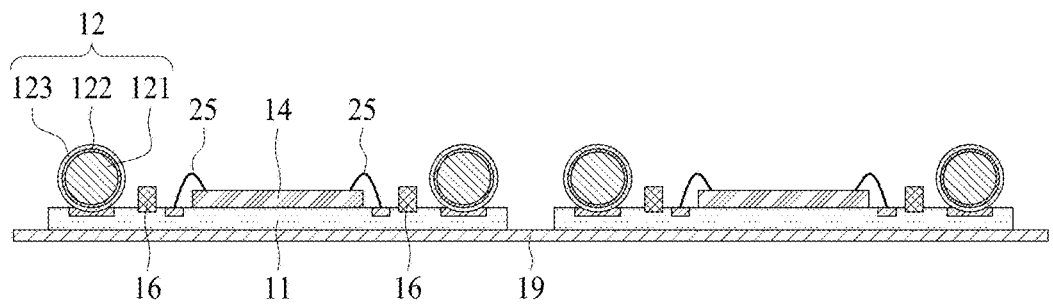
FIG. 11B illustrates one or more stages of a method of manufacturing surface mount structures in accordance with some embodiments of the present disclosure.
Figure 11C:
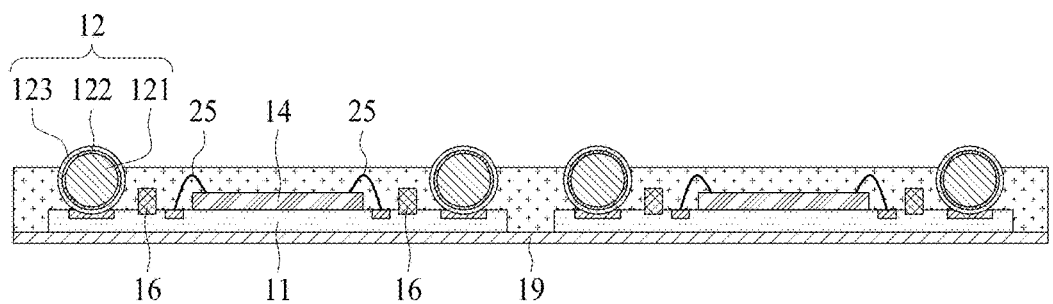
FIG. 11C illustrates one or more stages of a method of manufacturing surface mount structures in accordance with some embodiments of the present disclosure.

FIG. 11A, FIG. 11B and FIG. 11C illustrate various stages of a method of manufacturing surface mount structures in accordance with some embodiments of the present disclosure. The method shown in FIG. 11A, FIG. 11B and FIG. 11C is similar in certain respects to the method shown in FIG. 9A, FIG. 9B and FIG. 9C, except that the dies 14 are mounted onto the substrates 11 by wire bonding. Therefore, in some embodiments, the stages of solder reflowing; flux cleaning; under-fill (UF) 17 dispersing; and UF 17 curing can be omitted. In some embodiments, the following stages are performed to form one or more surface mount structures (e.g., surface mount structure 10 as shown in FIG. 2A): de-taping and singulation by sawing into individual package structures. In some embodiments, the surface mount structure 10 in FIG. 2B can also be manufactured with a method similar in certain respects to the method shown in FIG. 11A, FIG. 11B and FIG. 11C, except that the substrate strip is not sawn into individual substrates before molding.

Figure 12:
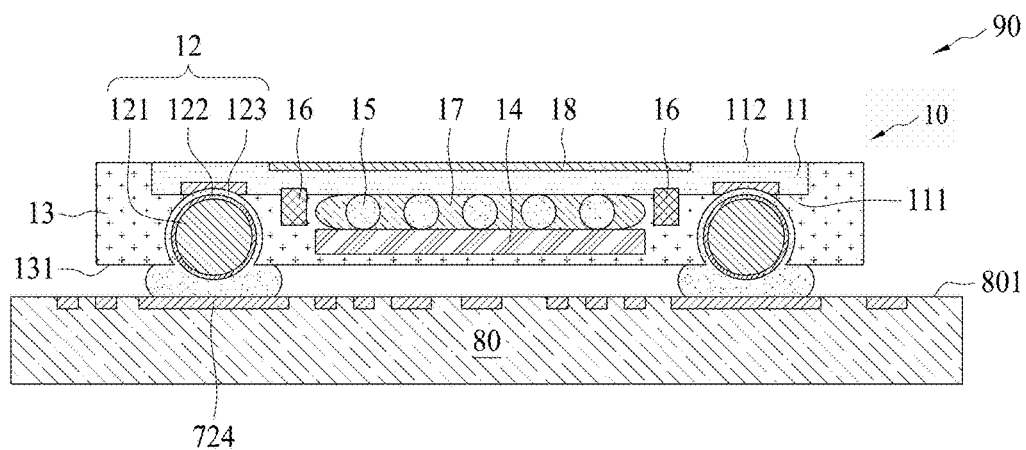
FIG. 12 illustrates a cross-sectional view of an electronic device in accordance with some embodiments of the present disclosure.

FIG. 12 illustrates a cross-sectional view of an electronic device 90 in accordance with some embodiments of the present disclosure. A semiconductor device package 10 similar to the surface mount structure 10 shown in FIG. 1A is to be mounted on an external circuit board 80 by a surface mount technique. The semiconductor device package 10 comprises a redistribution structure 11, a semiconductor device 14, electrical connections 12 and an encapsulant 13. The redistribution structure 11 has a first surface 111 and a second surface 112 opposite the first surface 111. The semiconductor device 14 is on the first surface 111 of the redistribution structure 11. The electrical connections 12 are on the first surface 111 of the redistribution structure 11. The encapsulant 13 encapsulates the first surface 111 of the redistribution structure 11, the semiconductor device 14 and the electrical connections 12. A portion of each of the electrical connections 12 is exposed by the encapsulant 13.

In some embodiments, the electronic device 90 as shown in FIG. 12 comprises the circuit board 80 and the semiconductor device package 10. The circuit board 80 has a first surface 801. The semiconductor device package 10 similar to the surface mount structure 10 shown in FIG. 1A is mounted on the first surface 801 of the circuit board 80. The exposed portion of each of the electrical connections 12 is directly mounted to and electrically connected to the circuit board 80. In some embodiments, the surface mount structures shown in FIG. 1B, FIG. 2A and FIG. 2B can also be mounted on the first surface 801 of the circuit board 80 in the same manner as shown in FIG. 12.

Figure 13:
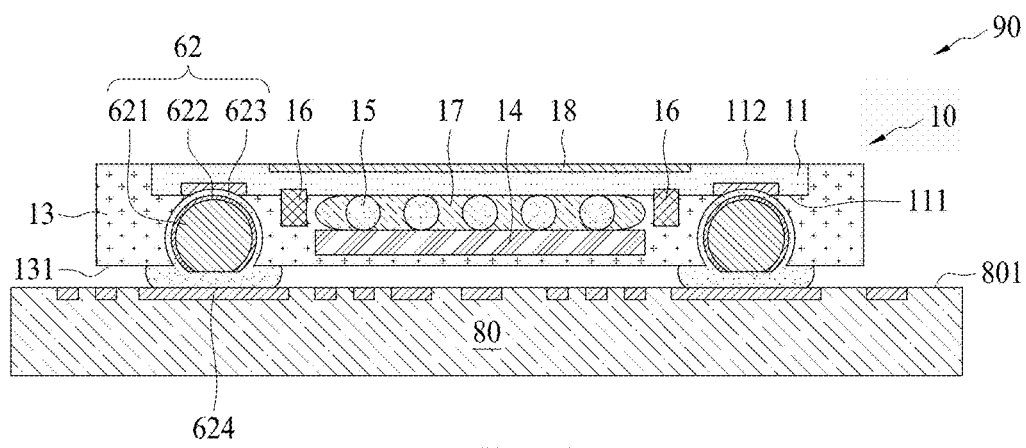
FIG. 13 illustrates a cross-sectional view of an electronic device in accordance with some embodiments of the present disclosure.

FIG. 13 illustrates a cross-sectional view of an electronic device 90 in accordance with some embodiments of the present disclosure. The electronic device 90 shown in FIG. 13 is similar in certain respects to the electronic device 90 shown in FIG. 12, except that in FIG. 13, each electrical connection 62 is ground to form a substantially planar surface 624 at the bottom of the electrical connection 62. The semiconductor device package 10 is similar to or the same as the surface mount structure 10 shown in FIG. 6A. The substantially planar surface 624 of the electrical connection 62 protrudes relative to the surface 131 of the encapsulant 13.

Figure 14:
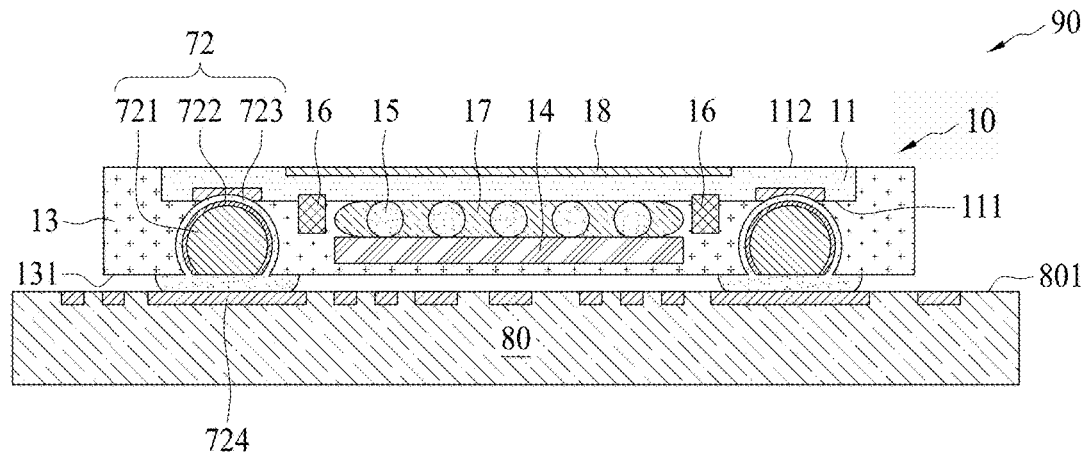
FIG. 14 illustrates a cross-sectional view of an electronic device in accordance with some embodiments of the present disclosure.

FIG. 14 illustrates a cross-sectional view of an electronic device 90 in accordance with some embodiments of the present disclosure. The electronic device 90 shown in FIG. 14 is similar in certain respects to the electronic device 90 shown in FIG. 12, except that in FIG. 14, each electrical connection 72 is ground to form a substantially planar surface 724 at the bottom of the electrical connection 72. The semiconductor device package 10 is similar to or the same as the surface mount structure 10 shown in FIG. 7A. The substantially planar surface 724 of the electrical connection 72 and the surface 131 of the encapsulant 131 are substantially coplanar.

Figure 15:
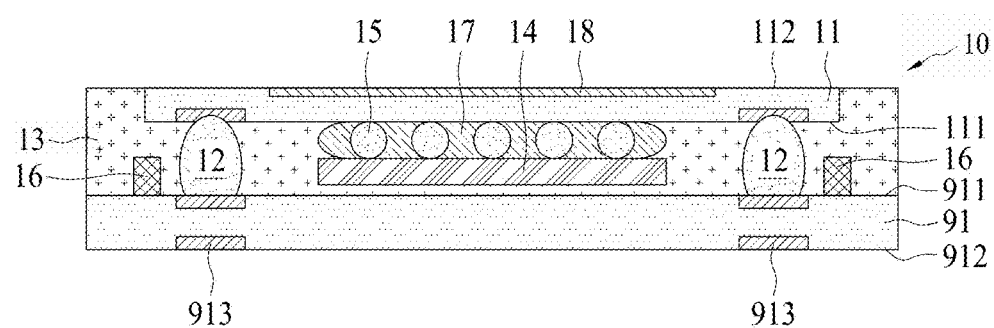
FIG. 15 illustrates a cross-sectional view of a surface mount structure in accordance with some embodiments of the present disclosure.

FIG. 15 illustrates a cross-sectional view of a surface mount structure 10 in accordance with some embodiments of the present disclosure. The surface mount structure 10 comprises a redistribution structure 11, electrical connections 12, an encapsulant 13, a semiconductor device 14, bumps 15, electronic components 16, an under-fill layer 17 and a package structure 91. The redistribution structure 11 has a surface 111 and a surface 112 opposite the surface 111. At least one of the electrical connections 12 is on the surface 111 of the redistribution structure 11. In some embodiments, the surface mount structure 10 further comprises a sensing area 18 adjacent to the surface 112 of the redistribution structure 11. The sensing area 18 can be used for, e.g., finger print sensing or any other light-sensing purposes.

The semiconductor device 14 is mounted on the surface 111 of the redistribution structure 11. The semiconductor device 14 and the redistribution structure 11 are electrically connected by the bumps 15. In some embodiments, the space between the bumps is filled with an under-fill layer 17. The package structure 91 has a surface 911 and a surface 912 opposite the surface 911. The redistribution structure 11 is mounted on the surface 911 the package structure 91. The electrical connections 12 are used to electrically connect the redistribution structure 11 and the package structure 91.

The electronic components 16 (e.g., resistors or capacitors) are also mounted on the surface 911 of the package structure 91. The encapsulant 13 encapsulates the surface 111 of the redistribution structure 11, the electrical connections 12 and the surface 911 of the package structure 91. The package structure 91 further comprises pads 913 on the surface 912 of the package structure 91. The pads 913 are used to fan-out the inputs and outputs of the semiconductor device 14.

Compared with the surface mount structures 10 shown in FIG. 1A, FIG. 1B, FIG. 2A, FIG. 2B, FIG. 4, FIG. 6A, FIG. 7A and FIG. 8A, the thickness of the surface mount structure 10 shown in FIG. 15 may be larger because there are two substrates (e.g., 11 and 91) in the surface mount structure 10 shown in FIG. 15. During the manufacturing of the surface mount structure 10 shown in FIG. 15, the stages related to mounting the redistribution structure 11 to the package structure 91 may be performed, thereby increasing the manufacturing cost.

Figure 16:
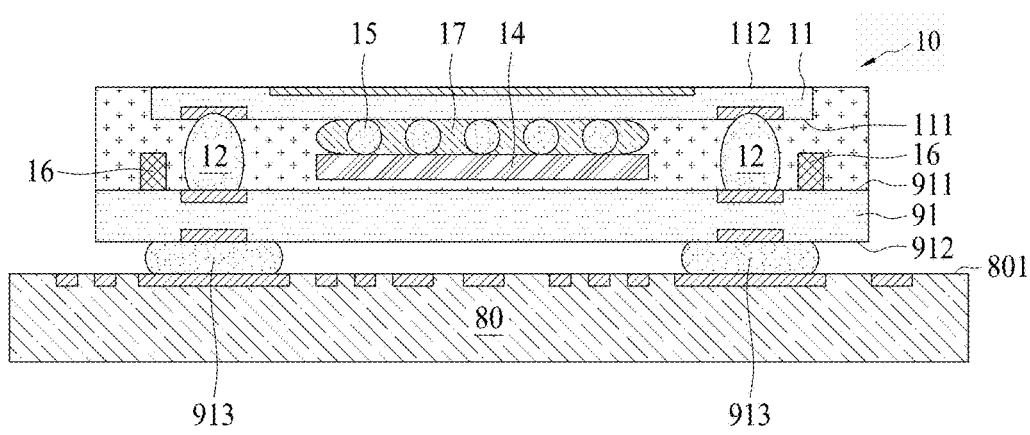
FIG. 16 illustrates a cross-sectional view of an electronic device in accordance with some embodiments of the present disclosure.

FIG. 16 illustrates a cross-sectional view of an electronic device 90 in accordance with some embodiments of the present disclosure. The electronic device 90 comprises a circuit board 80 and a semiconductor device package 10. The circuit board 80 has a first surface 801. The semiconductor device package 10 similar to the surface mount structure 10 shown in FIG. 15 is mounted on the first surface 801 of the circuit board 80. Compared with the electronic device 90 shown in FIG. 12, FIG. 13 and FIG. 14, the thickness of the electronic device 90 shown in FIG. 16 may be larger because there are two substrates (e.g., 11 and 91) in the electronic device 90 shown in FIG. 16.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another; this orientation is in accordance with the drawings, but is not required during manufacturing or use.

As used herein, the singular terms "a," "an," and "the" may include plural referents unless the context clearly dictates otherwise.

As used herein, the terms "connect," "connected," and "connection" refer to an operational coupling or linking. Connected components can be directly or indirectly coupled to one another, for example, through another set of components.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially" "substantial," and "about" refer to a considerable degree or extent. When used in conjunction with an event or situation, the terms can refer to instances in which the event or situation occurs precisely as well as instances in which the event or situation occurs to a close approximation, such as when accounting for typical tolerance levels of the manufacturing methods described herein. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

A surface can be deemed to be planar or substantially planar if a difference between a highest point and a lowest point on the surface is no greater than 5 μm, no greater than 2 μm, no greater than 1 μm, or no greater than 0.5 μm.

Additionally, amounts, ratios, and other numerical values are sometimes presented herein in a range format. It is understood that such range formats are used for convenience and brevity, and should be interpreted flexibly to include numerical values explicitly specified as limits of a range, as well as all individual numerical values or sub-ranges encompassed within that range, as if each numerical value and sub-range is explicitly specified.

In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims.

The construction and arrangement of the structures and methods as shown in the various example embodiments are illustrative only. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the example embodiments without departing from the scope of the present disclosure.

What is claimed is:

1. A surface mount structure, comprising:
a redistribution structure having a first surface and a second surface opposite the first surface;
an electrical connection on the first surface of the redistribution structure; and
an encapsulant encapsulating the first surface of the redistribution structure and the electrical connection;
wherein a portion of the electrical connection is exposed by the encapsulant,
the electrical connection comprises a core, and
the core comprises an elastic core and a metal layer surrounding the elastic core.

2. A surface mount structure, comprising:
a redistribution structure having a first surface and a second surface opposite the first surface;
an electrical connection on the first surface of the redistribution structure;
an encapsulant encapsulating the first surface of the redistribution structure and the electrical connection; and
a sensing area adjacent to the second surface of the redistribution structure,
wherein a portion of the electrical connection is exposed by the encapsulant.

3. A semiconductor device package, comprising:
a redistribution structure having a first surface and a second surface opposite the first surface;
a semiconductor device on the first surface of the redistribution structure;
an electrical connection on the first surface of the redistribution structure;
an encapsulant encapsulating the first surface of the redistribution structure, the semiconductor device and the electrical connection; and
a sensing area adjacent to the second surface of the redistribution structure,
wherein a portion of the electrical connection is exposed by the encapsulant.

4. An electronic device, comprising:
a circuit board having a first surface; and
a semiconductor device package mounted on the first surface of the circuit board, the semiconductor device package comprising:
a redistribution structure having a first surface and a second surface opposite the first surface;
a semiconductor device on the first surface of the redistribution structure;
an electrical connection on the first surface of the redistribution structure; and
an encapsulant encapsulating the first surface of the redistribution structure, the semiconductor device and the electrical connection;
wherein a portion of the electrical connection is exposed by the encapsulant, and the exposed portion of the electrical connection is mounted to the first surface of the circuit board.

5. The surface mount structure of claim 1, wherein the core further comprises a barrier layer surrounding the metal layer.

6. The surface mount structure of claim 5, wherein the electrical connection further comprises a solder layer surrounding the barrier layer.

7. The surface mount structure of claim 1, wherein the elastic core has a modulus of elasticity ranged from approximately 1 gigapascal (GPa) to approximately 50 GPa.

8. The surface mount structure of claim 1, wherein the elastic core has a modulus of elasticity ranged from approximately 3 GPa to approximately 6 GPa.

9. The surface mount structure of claim 1, wherein the elastic core comprises a polymer.

10. The surface mount structure of claim 1, wherein the metal layer defines a space and at least a portion of the elastic core is separated from the metal layer by the space.

11. The surface mount structure of claim 1, wherein the metal layer defines a space having an aspect ratio greater than 1.

12. The surface mount structure of claim 2, wherein the encapsulant has a first surface and the electrical connection has a substantially planar surface, and wherein the substantially planar surface of the electrical connection protrudes relative to the first surface of the encapsulant.

13. The surface mount structure of claim 1, wherein the encapsulant has a first surface and the electrical connection has a substantially planar surface, and wherein the substantially planar surface of the electrical connection and the first surface of the encapsulant are substantially coplanar.

14. The surface mount structure of claim 2, wherein the electrical connection comprises a metal core and a barrier layer surrounding the metal core, and wherein the metal core has a first substantially planar surface and the barrier layer has a first substantially planar surface, and wherein the first substantially planar surface of the metal core and the first substantially planar surface of the barrier layer are exposed by the encapsulant.

15. The surface mount structure of claim 14, wherein the electrical connection further comprises a solder layer surrounding the barrier layer, and wherein the solder layer has a first substantially planar surface and wherein the first substantially planar surface of the solder layer is exposed by the encapsulant.

16. The semiconductor device package of claim 3, wherein the encapsulant has a first surface and the electrical connection has a substantially planar surface, and wherein the substantially planar surface of the electrical connection protrudes relative to the first surface of the encapsulant.

17. The semiconductor device package of claim 3, wherein the encapsulant has a first surface and the electrical connection has a substantially planar surface, and wherein the substantially planar surface of the electrical connection and the first surface of the encapsulant are substantially coplanar.

18. The semiconductor device package of claim 3, wherein the electrical connection comprises a metal core and a barrier layer surrounding the metal core, wherein the metal core has a first substantially planar surface and the barrier layer has a first substantially planar surface, and wherein the first substantially planar surface of the metal core and the first substantially planar surface of the barrier layer are exposed by the encapsulant.

19. The semiconductor device package of claim 18, wherein the electrical connection further comprises a solder layer surrounding the barrier layer, wherein the solder layer has a first substantially planar surface and wherein the first substantially planar surface of the solder layer is exposed by the encapsulant.

20. The semiconductor device package of claim 3, wherein the exposed portion of the electrical connection has a substantially planar surface.

21. The electronic device of claim 4, wherein the exposed portion of the electrical connection has a substantially planar surface.

* * * * *